United States Patent
Ma et al.

(10) Patent No.: US 9,509,291 B1
(45) Date of Patent: Nov. 29, 2016

(54) CMOS DATA RESET CIRCUIT WITH INDICATING UNIT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Jin-Shan Ma, Shenzhen (CN); Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/806,260

(22) Filed: Jul. 22, 2015

(30) Foreign Application Priority Data

Jul. 10, 2015 (CN) .......................... 2015 1 0403108

(51) Int. Cl.
*H03L 7/00* (2006.01)
*H03K 3/356* (2006.01)
*H03K 17/22* (2006.01)

(52) U.S. Cl.
CPC ...... *H03K 3/356104* (2013.01); *H03K 17/223* (2013.01)

(58) Field of Classification Search
CPC ................................................ H03K 3/356104
See application file for complete search history.

(56) References Cited

U.S. PATENT DOCUMENTS

2015/0082056 A1* 3/2015 Hsieh ...................... G06F 1/266
713/300

* cited by examiner

*Primary Examiner* — Daniel Puentes
(74) *Attorney, Agent, or Firm* — Zhigang Ma

(57) ABSTRACT

A complementary metal oxide semiconductor (CMOS) data reset circuit includes a control unit, a south bridge chip including a reset pin electrically coupled to the control unit, and a indicating unit electrically coupled between the control unit and the south bridge chip. The control unit outputs a control signal to the reset pin and the indicating unit to cause resetting of the CMOS data by the south bridge chip and the indicating unit indicates the resetting of CMOS data as it takes place.

11 Claims, 4 Drawing Sheets

CMOS DATA RESET CIRCUIT WITH INDICATING UNIT

FIELD

The subject matter herein generally relates to data reset circuits.

BACKGROUND

When CMOS password is forgotten, users usually reset CMOS data though jumpers of mother boards. The jumper comprises a base and a keycap. A plurality of pins is located on the base. Users can arrange the keycap between two specific pins to reset CMOS data.

BRIEF DESCRIPTION OF THE DRAWINGS

Implementations of the present technology will now be described, by way of example only, with reference to the attached figures.

DETAILED DESCRIPTION

Figure 1:
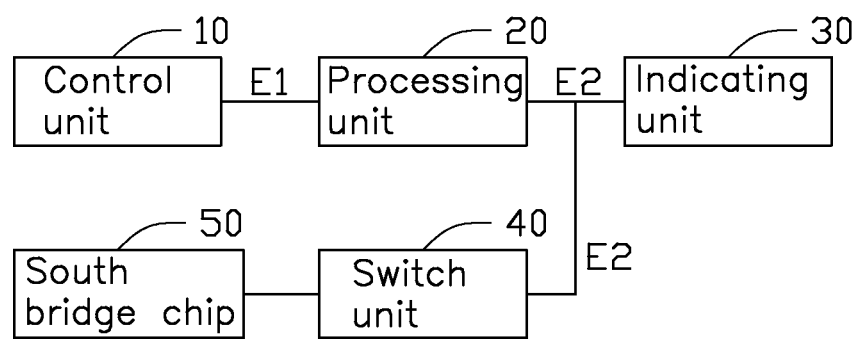
FIG. 1 is a block diagram of an embodiment of a CMOS data reset circuit comprising a control unit, a processing unit, an indicating unit, a switch unit, and a south bridge chip.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

The present disclosure is described in relation to data reset circuits.

FIG. 1 illustrates an embodiment of a CMOS data reset circuit. The CMOS data reset circuit comprises a control unit 10, a processing unit 20, an indicating unit 30, a switch unit 40, and a south bridge chip 50. The processing unit 20 is electrically coupled to the control unit 10. The south bridge chip 50 is electrically coupled to the processing unit 20 through the switch unit 40. The indicating unit 30 is electrically coupled between the processing unit 20 and the switch unit 40. The control unit 10 outputs a control signal E1 to the processing unit 20. When the control signal E1 is received, the processing unit 20 outputs a processing signal E2 to the indicating unit 30 and the switch unit 40. An indicating signal E3 (shown in FIG. 3) is output by the indicating unit 30 when the processing signal E2 is received. The south bridge chip 50 resets CMOS data in accordance with the processing signal E2 when received.

Figure 2:
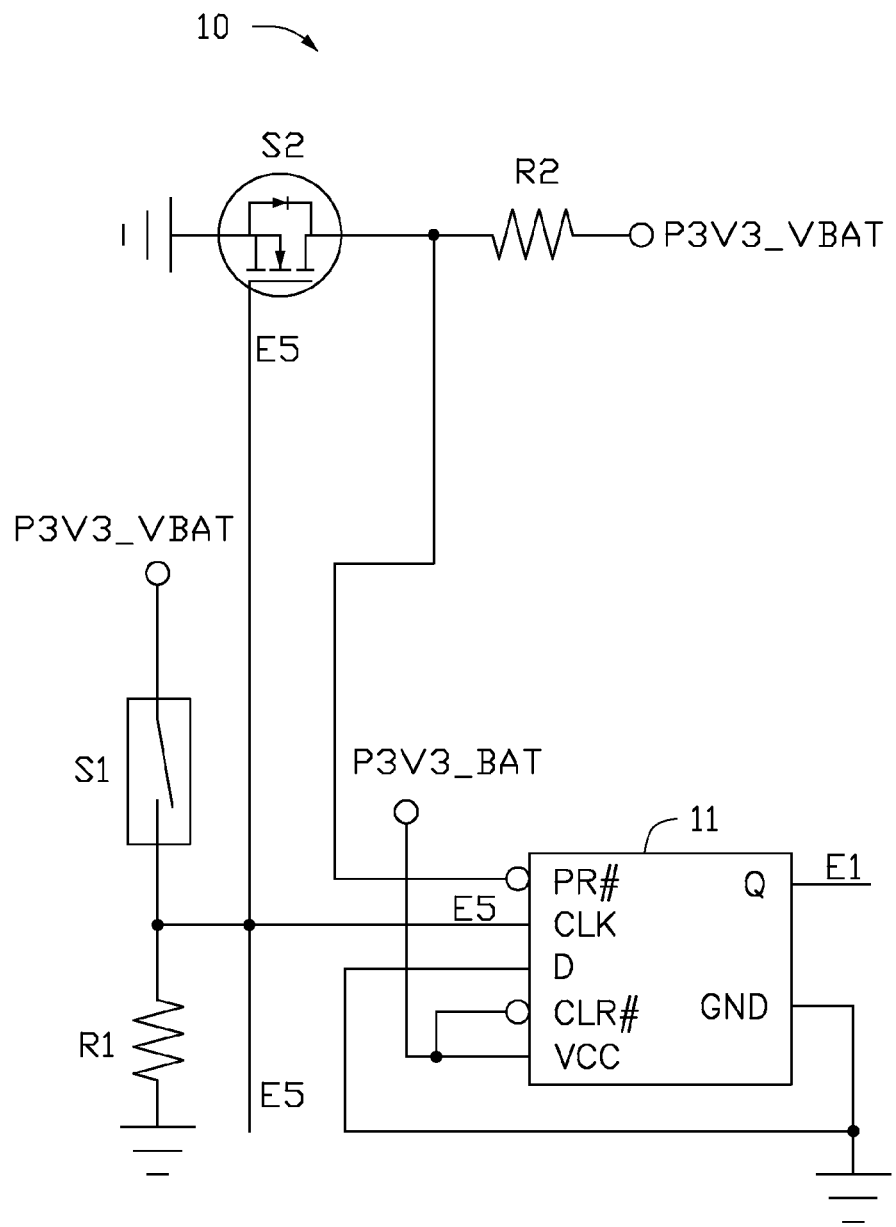
FIG. 2 is a circuit diagram of the control unit of FIG. 1.

FIG. 2 illustrates the control unit 10. The control unit 10 comprises a switch S1, an electronic switch S2, and a flip-flop 11. In at least one embodiment, the flip-flop 11 can be a data flip-flop. The electronic switch S2 can be an n-channel metal-oxide semiconductor field-effect transistor (NMOSFET).

A first terminal of the switch S1 is electrically coupled to a power supply P3V3_VBAT. A second terminal of the switch S1 is grounded through a resistor R1.

The flip-flop 11 comprises a clock pin CLK, a preset pin PR #, a clear pin CLR #, a data pin D, an output pin Q, a grounding pin GND, and a power supply pin VCC. The clock pin CLK is electrically coupled to the second terminal of the switch S1, and is grounded through the resistor R1. The clock pin CLK is further electrically coupled to a first terminal of the electronic switch S2. The preset pin PR # is electrically coupled to the power supply P3V3_VBAT through a resistor R2, and is further electrically coupled to a second terminal of the electronic switch S2. The data pin D and the grounding pin GND are grounded. The clear pin CLR # and the power supply pin VCC are electrically coupled to the power supply P3V3_VBAT. A third terminal of the electronic switch S2 is grounded. The output pin Q is electrically coupled to the processing unit 20.

Figure 3:
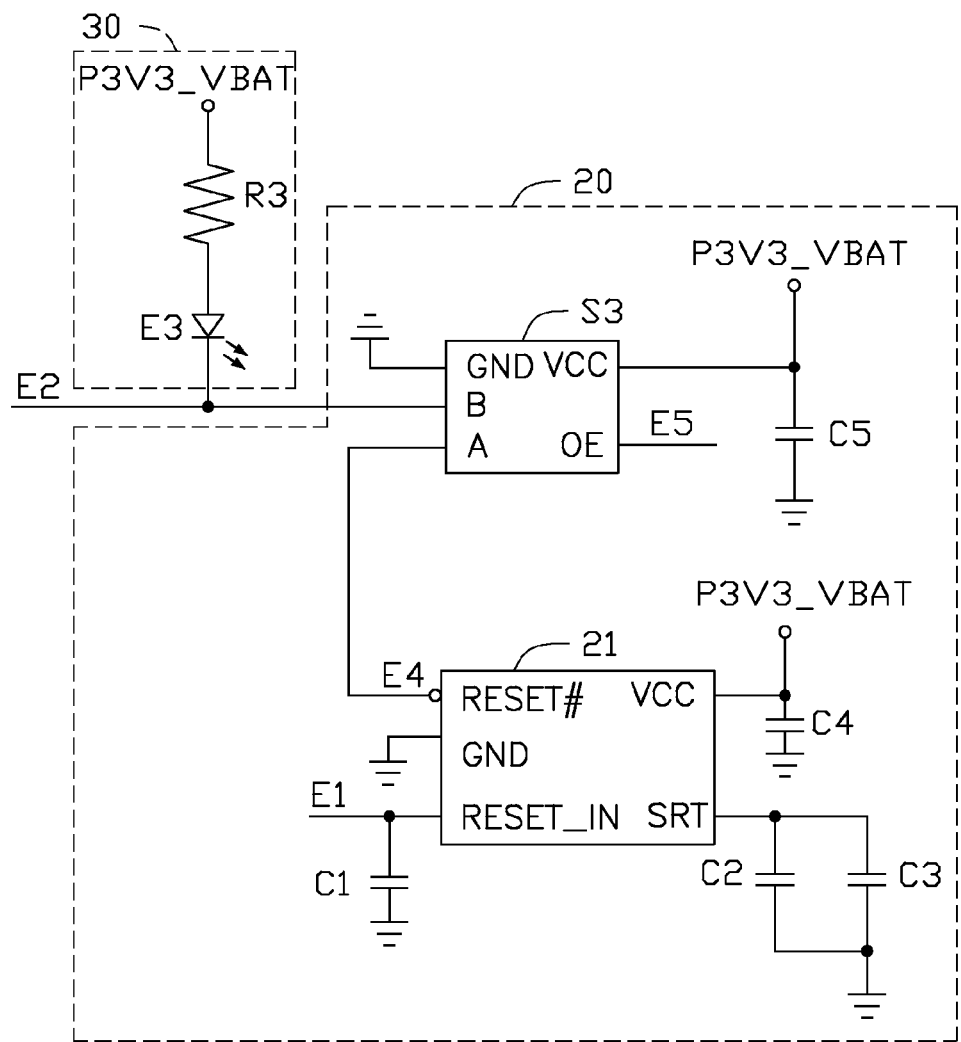
FIG. 3 is a circuit diagram of the processing unit and the indicating unit of FIG. 1.

FIG. 3 illustrates the processing unit 20. The processing unit 20 comprises a reset chip 21 and a switch chip S3. The reset chip 21 comprises an input pin RESET_IN, an output pin RESET #, a timeout reset pin SRT, a grounding pin GND, and a power supply pin VCC. The input pin RESET_IN is electrically coupled to the output pin Q of the flip-flop 11. The input pin RESET_IN is electrically coupled to the output pin Q, and is grounded through a capacitor C1. The timeout reset pin SRT is grounded through capacitors C2 and C3 and resets the input pin RESET_IN after a limited time. The output pin RESET # is electrically coupled to the switch chip S3. The grounding pin GND is grounded. The power supply pin VCC is electrically coupled to the power supply P3V3_VBAT and is grounded through a capacitor C4. In at least one embodiment, the limited time is two seconds.

The switch chip S3 comprises an input pin A, an output pin B, a grounding pin GND, a power supply pin VCC, and an enable pin OE. The input pin A is electrically coupled to the output pin RESET # of the reset chip 21. The grounding pin GND is grounded. The power supply pin VCC is electrically coupled to the power supply P3V3_VBAT and is grounded through a capacitor C5. The enable pin OE is electrically coupled to the clock pin CLK of the flip-flop 11.

FIG. 3 further illustrates the indicating unit 30. The indicating unit 30 comprises a light emitting diode (LED). A cathode of the LED is electrically coupled to the output pin B of the switch chip S3. An anode of the LED is electrically coupled to the power supply P3V3_VBAT through a resistor R3.

Figure 4:
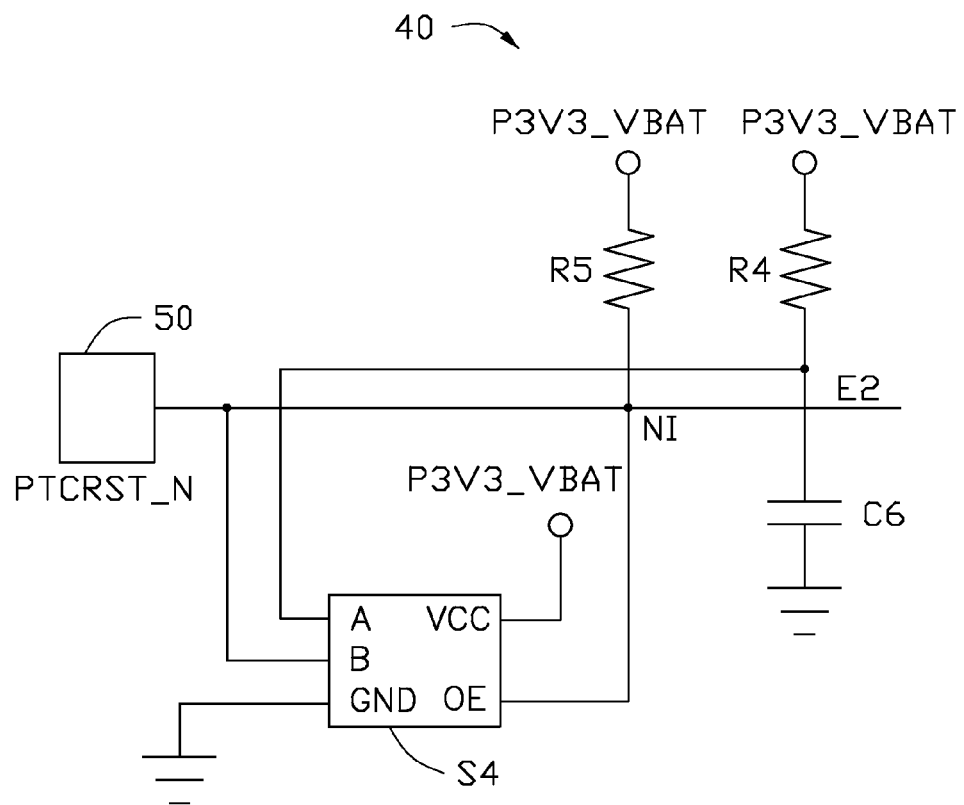
FIG. 4 is a circuit diagram of the switch unit and the south bridge chip of FIG. 1.

FIG. 4 illustrates the switch unit 40. The switch unit 40 comprises a switch chip S4. The switch chip S4 comprises an input pin A, an output pin B, a grounding pin GND, a power supply pin VCC, and an enable pin OE. The input pin A is electrically coupled to the power supply P3V3_VBAT through a resistor R4 and is grounded through a capacitor C6. The grounding pin GND is grounded. The power supply pin VCC is electrically coupled to the power supply P3V3_VBAT. The enable pin OE is electrically coupled to the power supply P3V3_VBAT through a resistor R5 and is electrically coupled to the output pin B of the switch chip S3 and the cathode of the LED. The output pin B of the switch chip S4 is electrically coupled to the output pin B of the switch chip S3 and the cathode of the LED, and electrically coupled to a reset pin RTCRST_N of the south bridge chip 50.

When the switch S1 is turned on, the switch S1 outputs a high level signal E5 to the first terminal of the electronic switch S2 and the electronic switch S2 is turned on. The electronic switch S2 outputs a low level signal to the preset pin PR # of the flip-flop 11. The output pin Q of the flip-flop 11 outputs a low level control signal E1 to the input pin RESET_IN of the reset chip 21, and the output pin RESET # of the reset chip 21 outputs a low level signal E4 to the input pin A of the switch chip S3 during the limited time. The enable pin OE receives the high level signal E5, and the switch chip S3 operates. The output pin B outputs the low level processing signal E2 to the LED, to the reset pin RTCRST_N of the south bridge chip 50, and to the enable pin OE of the switch chip S4 during the limited time. The enable pin OE of the switch chip S4 receives the low level processing signal E2 thus the switch chip S4 does not operate. The reset pin RTCRST_N of the south bridge chip 50 receives the low level processing signal E2 to activate the resetting of the CMOS data by the south bridge chip 50. When the LED receives the low level processing signal E2, the LED is lit to indicate the resetting of CMOS data by the south bridge chip 50.

After the limited time, the output pin RESET # is reset and outputs high level signal E4 to the input pin A of the switch chip S3. The output pin B of the switch chip S3 outputs high level processing signal E2 to the LED, to the reset pin RTCRST_N of the south bridge chip 50, and to the enable pin OE of the switch chip S4. The enable pin OE of the switch chip S4 receives the high level processing signal E2 and the switch chip S4 operates. The reset pin RTCRST_N of the south bridge chip 50 receives the high level processing signal E2 and thus stops resetting. The high level processing signal E2 received by the LED discontinues the illumination of the LED, indicating that the south bridge chip 50 has stopped resetting CMOS data. The first switch S1 is released.

The embodiments shown and described above are only examples. Many details are often found in the art such as the other features of a CMOS data reset circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A complementary metal oxide semiconductor (CMOS) data reset circuit comprising:
a control unit configured to output a control signal;
a south bridge chip electrically coupled to the control unit and comprising a reset pin, the reset pin configured to enable the south bridge chip to reset CMOS data in accordance with the control signal; and
an indicating unit electrically coupled to the control unit and the south bridge chip, and configured to output an indicating signal in accordance with the control signal;
wherein the indicating signal is configured to indicate the resetting of the CMOS data by the south bridge chip and indicate that the south bridge chip has stopped resetting CMOS data.

2. The CMOS data reset circuit of claim 1, further comprising a processing unit, wherein the processing unit is electrically coupled to the control unit, the south bridge chip and the indicating unit, the processing unit is configured to output a processing signal in accordance with the control signal to the south bridge chip and the indicating unit, the reset pin of the south bridge chip is configured to make the south bridge chip reset CMOS data in accordance with the processing signal, and the indicating unit is configured to output the indicating signal in accordance with the processing signal.

3. The CMOS data reset circuit of claim 2, wherein the control unit comprises a switch and a flip-flop, the flip-flop comprises a clock pin electrically coupled to the switch and an output pin electrically coupled to the processing unit, and the flip-flop is configured to output the control signal to the processing unit by the switch.

4. The CMOS data reset circuit of claim 3, wherein the control unit further comprises a electronic switch, and the flip-flop further comprises a preset pin, a clear pin and a data pin; and the preset pin and the clear pin are electrically coupled to a power supply, the data pin is grounded, and a electronic switch first terminal is electrically coupled to the clock pin and the switch, a electronic switch second terminal is electrically coupled to the preset pin, and a electronic switch third terminal is grounded.

5. The CMOS data reset circuit of claim 3, wherein the processing unit comprises a reset chip, the reset chip comprises an input pin and an output pin; the reset chip input pin is electrically coupled to the flip-flop output pin, and the reset chip output pin is electrically coupled to the indicating unit and the south bridge chip reset pin.

6. The CMOS data reset circuit of claim 5, wherein the reset chip further comprises a timeout reset pin, the timeout reset pin is grounded through at least one capacitor and is configured to reset the reset chip output pin after a limited time.

7. The CMOS data reset circuit of claim 5, wherein the processing unit further comprises a first switch chip, the first switch chip comprises an input pin, an output pin, and an enable pin; and the first switch chip input pin is electrically coupled to the reset chip output pin, the enable pin is electrically coupled to the clock pin and the switch, and the first switch chip output pin is electrically coupled to the indicating unit and the south bridge chip reset pin, to output the processing signal to the indicating unit and the south bridge chip.

8. The CMOS data reset circuit of claim 7, wherein a indicating unit first terminal is electrically coupled to the switch chip output pin, and a indicating unit second terminal is electrically coupled to the power supply.

9. The CMOS data reset circuit of claim 8, wherein the indicating unit comprises a light emitting diode.

10. The CMOS data reset circuit of claim 2, further comprising a switch unit, wherein the switch unit is electrically coupled to the processing unit, the south bridge chip reset pin and the indicating unit, when the processing signal is low level signal, the switch unit does operate, the south bridge chip reset pin receives the low level signal.

11. The CMOS data reset circuit of claim 10, wherein the switch unit comprises a second switch chip, the second switch chip comprises an input pin, an output pin and an enable pin; and the second switch chip input pin is electrically coupled to the power supply through a first resistor, the second switch chip enable pin is electrically coupled to the power supply through a second resistor, the enable pin is electrically coupled to the processing unit and the indicating unit to receive the processing signal, the second switch chip output pin is electrically coupled to the south bridge chip.

* * * * *